US009670574B2

(12) United States Patent
Hyndman et al.

(10) Patent No.: US 9,670,574 B2
(45) Date of Patent: Jun. 6, 2017

(54) METHODS OF DEPOSITING ALUMINIUM LAYERS

(75) Inventors: Rhonda Hyndman, Maghera (GB); Stephen Burgess, Wales (GB)

(73) Assignee: SPTS TECHNOLOGIES LIMITED, Newport, Gwent (GB)

( * ) Notice: Subject to any disclaimer, the term of this patent is extended or adjusted under 35 U.S.C. 154(b) by 979 days.

(21) Appl. No.: 13/397,779

(22) Filed: Feb. 16, 2012

(65) Prior Publication Data

US 2012/0208363 A1    Aug. 16, 2012

Related U.S. Application Data

(60) Provisional application No. 61/443,405, filed on Feb. 16, 2011.

(51) Int. Cl.
| C23C 14/00 | (2006.01) |
| C23C 14/02 | (2006.01) |
| C23C 14/16 | (2006.01) |
| C23C 14/34 | (2006.01) |

(52) U.S. Cl.
CPC .......... *C23C 14/025* (2013.01); *C23C 14/165* (2013.01); *C23C 14/345* (2013.01)

(58) Field of Classification Search
CPC ............................ C23C 14/025; C23C 14/345
USPC ...................................................... 204/192.1
See application file for complete search history.

(56) References Cited

U.S. PATENT DOCUMENTS

| 5,080,455 A * | 1/1992 | King et al. ..................... 359/350 |
| 5,355,020 A | 10/1994 | Lee et al. |
| 6,107,182 A | 8/2000 | Asahina et al. |
| 6,242,288 B1 | 6/2001 | Francis et al. |
| 7,781,327 B1 * | 8/2010 | Kailasam et al. ............. 438/622 |
| 2002/0094378 A1 * | 7/2002 | O'Donnell et al. ....... 427/249.1 |
| 2004/0154748 A1 * | 8/2004 | Rich et al. ................ 156/345.51 |
| 2007/0037393 A1 | 2/2007 | Chiang et al. |
| 2009/0246385 A1 * | 10/2009 | Felmetsger et al. .......... 427/301 |

FOREIGN PATENT DOCUMENTS

| CN | 1068444 A | 1/1993 |
| CN | 1142120 A | 2/1997 |
| JP | H01150335 | 6/1989 |
| JP | H05211133 | 8/1993 |
| JP | H09260645 | 10/1997 |
| JP | 2009506212 | 2/2009 |

(Continued)

OTHER PUBLICATIONS

Wang, Iton. "Thin Film Stresses in TiW/AlCuSi/TiW Sandwich Structures."MRS Proceedings. vol. 130. No. 1. Cambridge University Press, 1988.*

(Continued)

*Primary Examiner* — Ibrahime A Abraham

(74) *Attorney, Agent, or Firm* — Volentine & Whitt, PLLC

(57) ABSTRACT

A method of depositing an aluminum film on a substrate includes placing the substrate on a support, depositing a first layer of aluminum onto the substrate with the substrate in an unclamped condition, clamping the substrate to the support and depositing a second layer of aluminum continuous with the first layer. The second layer is thicker than the first layer and the second layer is deposited at a substrate temperature of less than about 22° C.

18 Claims, 9 Drawing Sheets

Cross Section 8μm Al film deposited with SPTS Process 1
(1μm Al unclamped + 7μm clamped, -15°C, No Bias)

(56) References Cited

FOREIGN PATENT DOCUMENTS

JP          2010182807         8/2010
WO          2008/063754 A2     5/2008

OTHER PUBLICATIONS

Raghavan, V.,J Journal of Phase Equilibria and Diffusion, Al—Cu—Si (Aluminum-Copper-Silicon) http://dx.doi.org/10.1007/s11669-012-9982-6 Springer US 8 Feb. 1, 2012.*
Wiley, T.B., 1980 ,0197-0216 , Bulletin of Alloy Phase Diagrams,The Al—Cu (Aluminum-Copper) http://dx.doi.org/10.1007/BF02883281 Springer Mar. 1, 1980.*
Extended European Search Report Dated May 8, 2012.
Chinese Office Action in Corresponding Chinese Application No. 201210035053.8 Dated Sep. 16, 2015.
Japanese Office Action in Corresponding Japanese Application No. 2012-030825 Dated Oct. 27, 2015.

\* cited by examiner

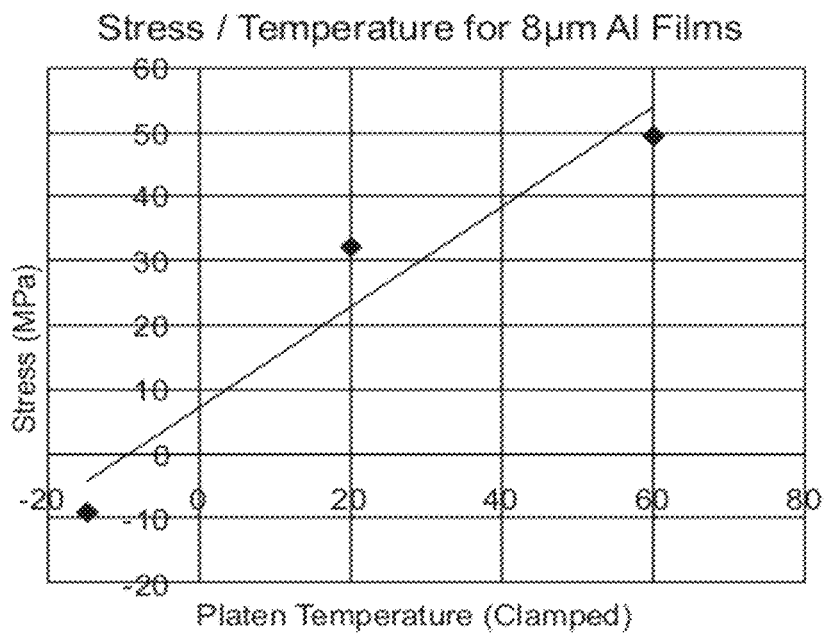
Figure 1   Stress versus Platen Temperature for Clamped 8μm Al Films No RF Bias
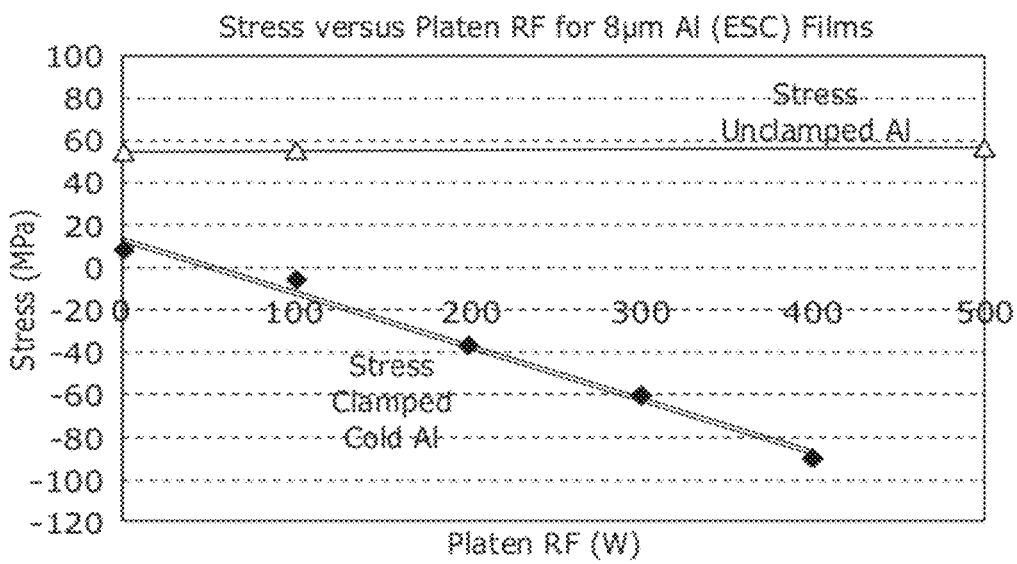
Figure 2   Stress versus Platen RF for Clamped & unclamped 8μm Al Films

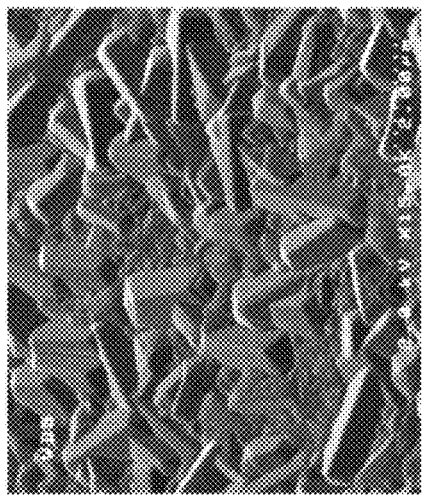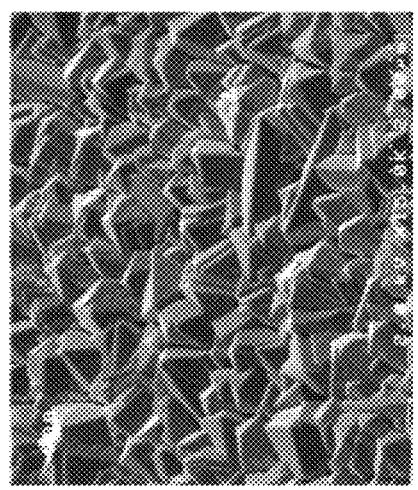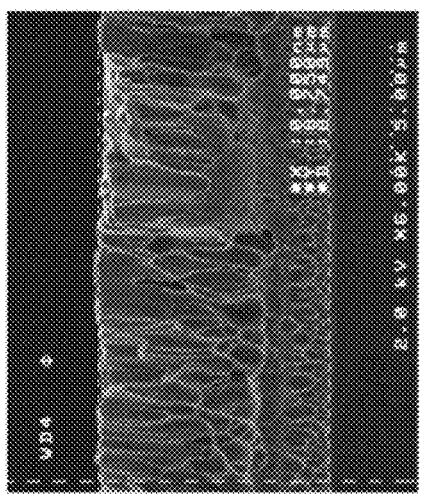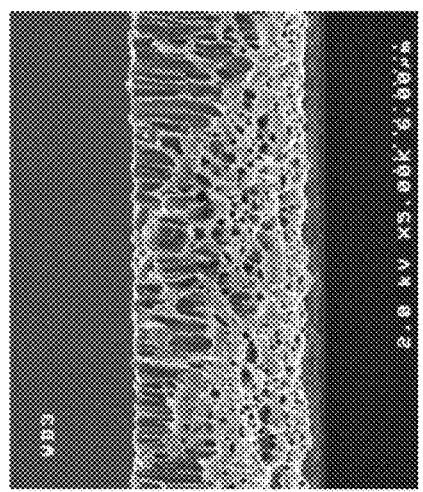
Figure 3: SEM Image 8μm Al film deposited at 1.8μm/min on an Electrostatic Chuck at -15°C (No Bias)
Figure 4: SEM Image 8 m Al film deposited at 0.6μm/min on an Electrostatic Chuck at -15°C (No Bias)

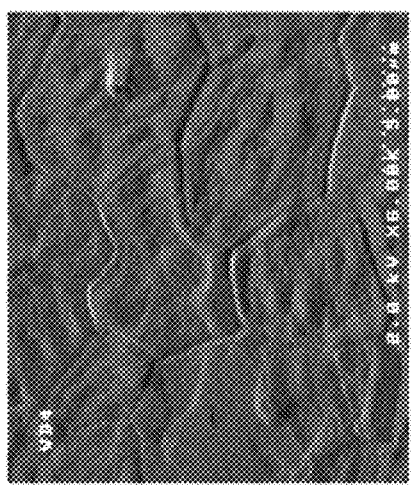
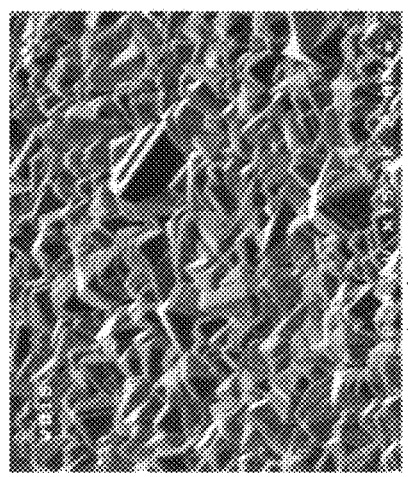
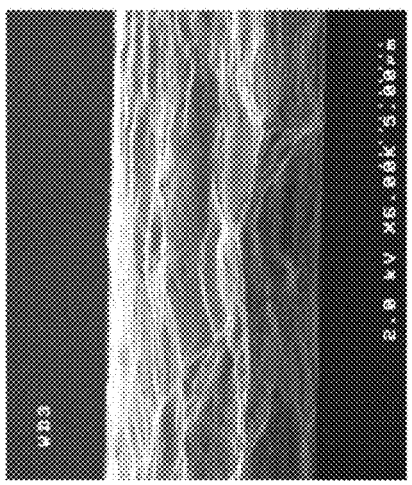
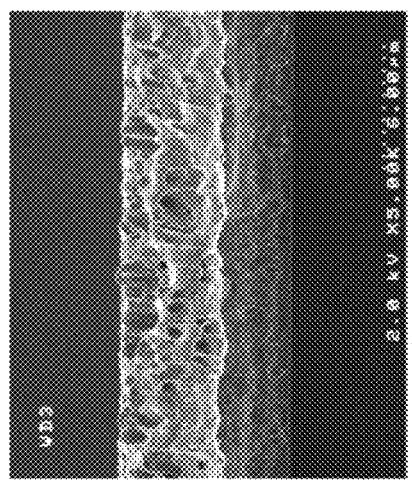
Figure 5: SEM Image 8μm Al film deposited at 1.8μm/min on a standard platen (unclamped) – wafer temperature ~150°C
Figure 6: SEM Image 8μm Al film deposited at 24kW, on an Electrostatic Chuck at -15°C, Starting Wafer Temperature 250°C

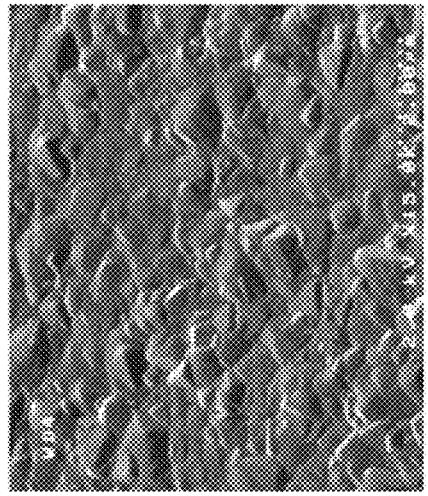
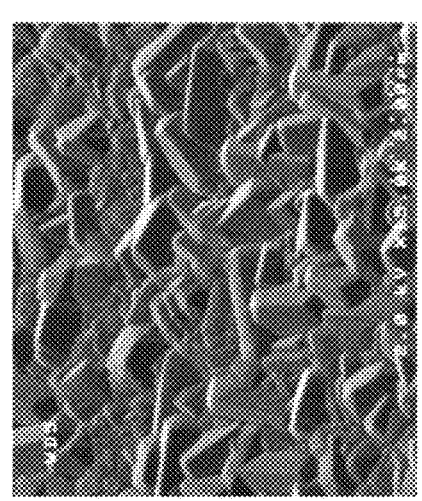
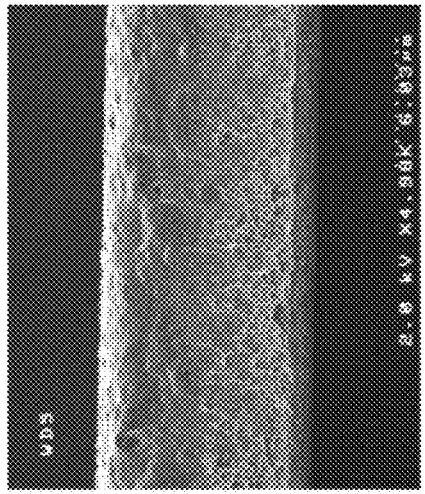
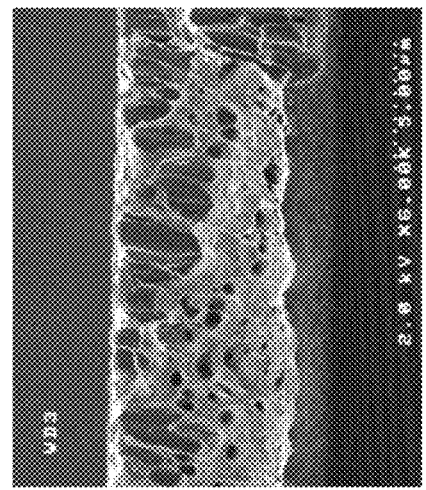
Figure 7: SEM Image 8μm Al film deposited at on an Electrostatic Chuck at -15°C (No Bias), Starting Wafer Temperature 400°C
Figure 8: SEM Image 8μm Al film deposited at 1.8μm/min on an Electrostatic Chuck at -15°C (100W Bias)

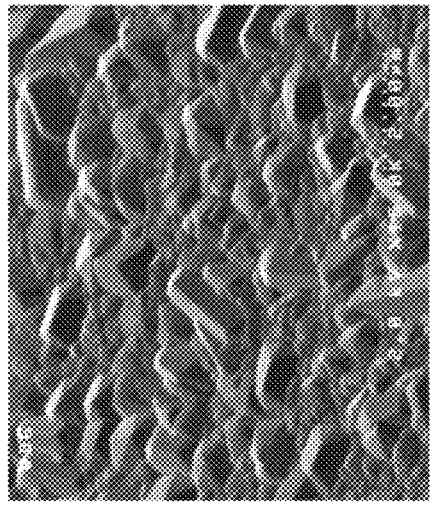
Figure 9: SEM Image 8μm Al film deposited at 1.8μm/min on an Electrostatic Chuck at -15°C (300W Bias)
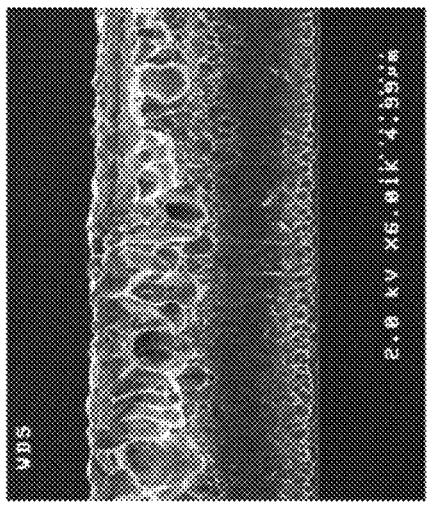
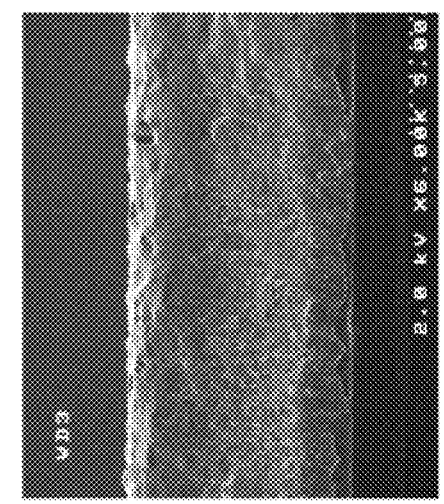
Figure 10: Cross Section 8μm Al film deposited with SPTS Process 1 (1μm Al unclamped + 7μm clamped, -15°C, No Bias)

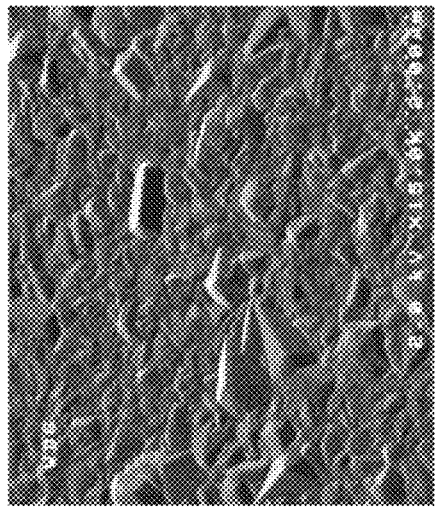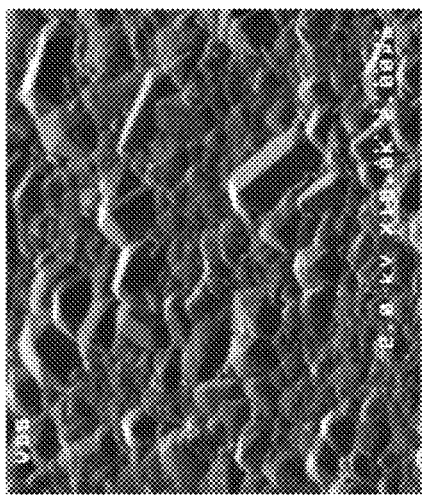
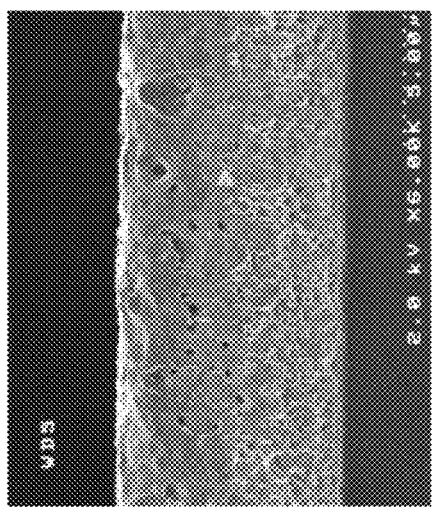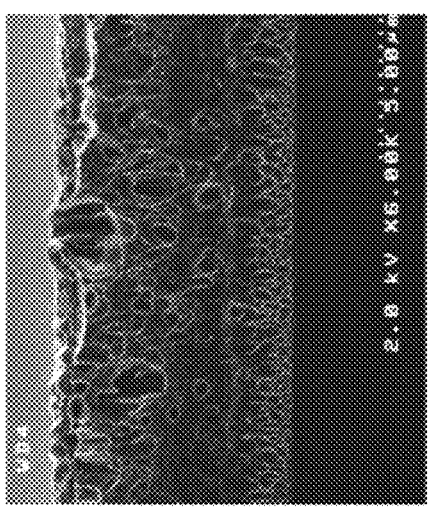
Figure 11: Cross Section 8μm Al film deposited with SPTS Process 2 (0.5μm Al unclamped + 7μm clamped, -15°C, No Bias)
Figure 12: Cross Section 8μm Al film deposited with SPTS Process (0.2μm Al unclamped + 7μm clamped, -15°C, No Bias)

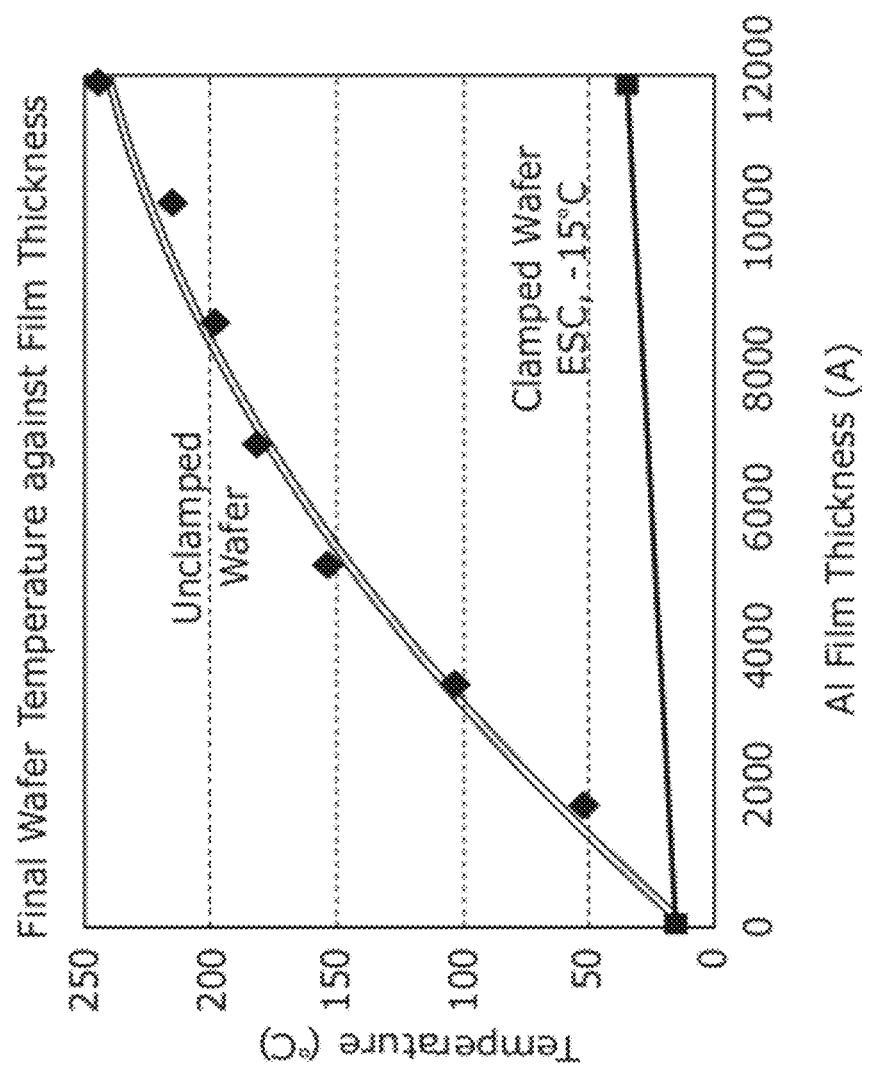
Figure 13: Wafer Temperature against deposited thickness for 1.8μm/min Al deposition

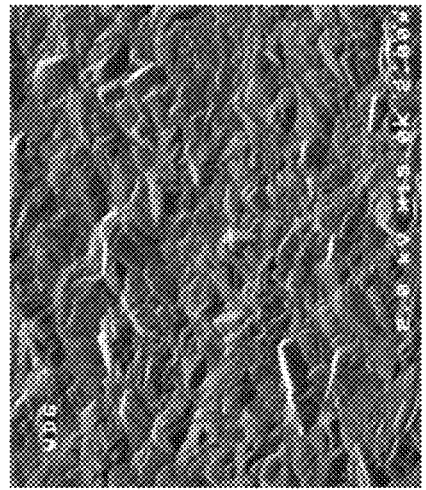
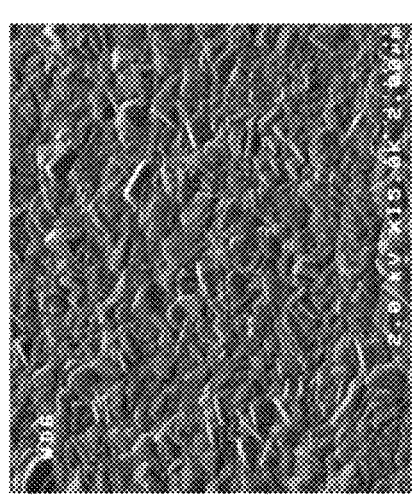
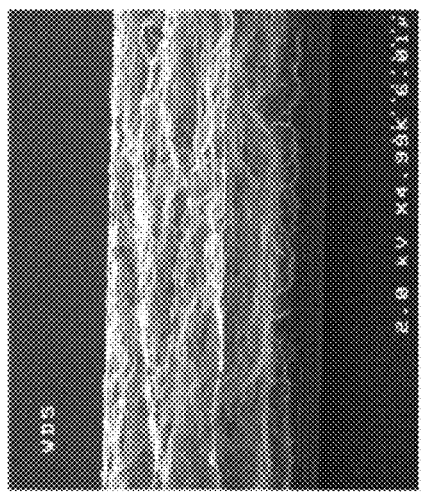
Figure 14: Cross Section 8µm Al film deposited with SPTS Process (1µm Al unclamped + 7µm clamped, -15°C, 150W)
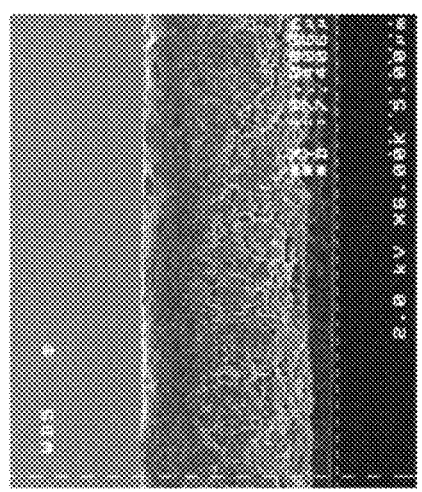
Figure 15: Cross Section 8µm Al film deposited with SPTS Process (0.5µm Al unclamped and 7µm clamped, -15°C, No Bias)

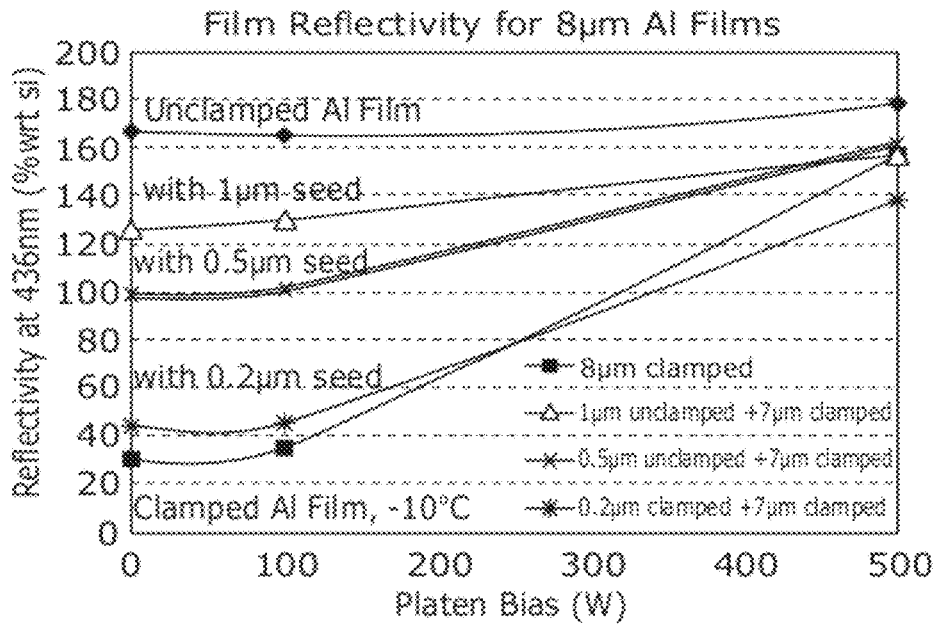
Figure 16  Reflectivity (%wrt si) of 8μm Al films deposited under different process conditions
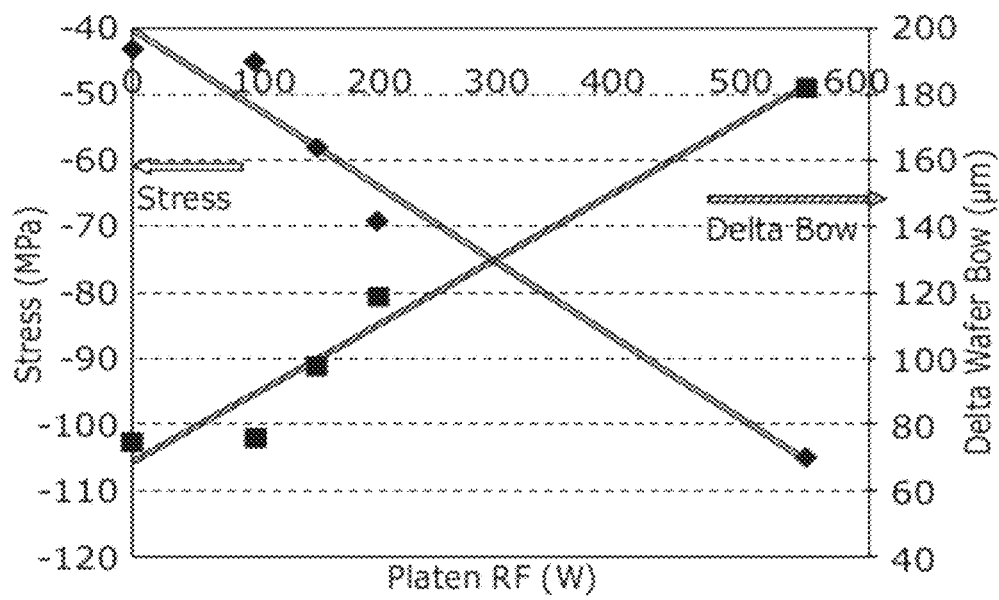
Figure 17  Stress Bias Curve for SPTS Process (1μm unclamped + 7μm clamped, -15°C)

METHODS OF DEPOSITING ALUMINIUM LAYERS

BACKGROUND

This invention relates to the deposition of aluminium layers or films on a thin substrate.

In a number of applications, silicon wafers require thick aluminium layers to be deposited on them. For example, when the device being formed from the wafer includes high powered transistors, thick aluminium layers may be necessary as contact layers in order to handle the very high current densities inherent in these devices.

Typically such devices have a vertical architecture with a source contact comprising one or more aluminium layers from 1-20 µm thickness. These are deposited onto the semiconductor device (up to e.g. MOSFET.IGBT Bipolar) imbedded on a full thickness wafer. Typically the drain contact is formed on the back of the wafer. However, as most of the thickness is not useful to the device performance, but rather contributes to series resistance which wastes power, the wafers are ground back from typically 720 µm to <200 µm thick prior to the deposition of the drain contact. Such thin wafers are fairly flexible and subject to considerable warpage or bowing when under the stress induced by the various deposited layers.

It is known that sputtered aluminium layers deposited at temperatures >~20° C. are tensile due to the mismatch of thermal expansion of the film and underlying substrate. Thus an 8 µm sputter Al film typically has a stress of ~60 MPa. Table 1 below sets out the bow that can be induced in wafers of various thicknesses.

TABLE 1

Induced Wafer Bow for different thickness Wafers as calculated using Stoney's Equation

| Wafer Thickness µm | Stress MPa | Wafer Bow µm |
|---|---|---|
| 720 | 60 | 154 |
| 200 | 60 | 1992 |
| 100 | 60 | 7669 |

It will be seen that for a 200 µm Si wafer a bow of approximately ~2 mm can be induced. Such a bow makes the wafer difficult to process in subsequent steps.

It is known that stress can be reduced to nearly zero by sputtering the film at low temperature with the wafer clamped to a cooled electrostatic chuck. The relationship between stress and platen or chuck temperature for an 8 µm film when there is no RF bias on the platen is shown in FIG. 1. It is further known that stress can be made compressive through the addition of RF bias and this is illustrated in FIG. 2.

SUMMARY

The Applicants have identified, however, that low temperature, clamped aluminium exhibits an unfavourable grain structure comprising a very small columnar grain separated by quite large voids. This structure can be seen clearly in FIGS. 3 and 4, which are scanning electro micrographs (SEM) of 8 µm aluminium films deposited at ~15° C. on an electrostatic chuck (ESC) at two different deposition rates (1.8 µm/min and 0.6 µm/min respectively). It will be readily understood that this rough and voided grain structure can compromise the electromechanical properties of the device leading to a reduction in the device performance. Thus there may be increased resistivity and reduced device lifetimes amongst other disadvantages.

FIG. 5 shows a more typical grain structure of an unclamped 8 µm aluminium film. It will be seen that there are large flat hexagonal grains entirely without voids. Attempts have been made to recover the grain structure to some degree by preheating the wafer in a separate module immediately before the Al deposition takes place. However, research has indicated that the starting temperature of the wafer needs to be ~400° C. for this to be effective. This is illustrated by the two processes shown in FIGS. 6 and 7. However, it will be seen that the wafer needs to be heated to around 400° C. to substantially get rid of the voids. This temperature is too high to allow stable processing of the underlying structure. Increasing the initial wafer temperature also leads to an increase in tensile stress of the Al film, which therefore becomes more difficult to compensate by bias. The Applicants have therefore determined that this approach does not provide a realistic solution for the problem of improving the aluminium grain structure and maintaining low stress at the same time.

FIGS. 8 and 9 illustrate that the addition of RF bias to densify the film to some degree. This renders the films compressive as indicated in FIG. 2. However, it can be seen that this does not significantly improve the grain structure. The problem of surface roughness and voiding persists up to very high biases.

The Applicants have determined a way of depositing such aluminium and aluminium alloy films, which overcomes or at least mitigates the above problems of excessive stress and poor grain structure.

The invention consists in a method of depositing an aluminium film or aluminium alloy on a thin substrate including:

placing the substrate on the support;

depositing a first layer of aluminium or aluminium alloy onto the substrate with the substrate in an unclamped condition; and clamping the substrate to the support and depositing a second layer of aluminium continuous with the first layer wherein the second layer is thicker than the first layer and the second layer is deposited at the substrate temperature of ~<22° C. preferably or <20° C.

The method preferably includes providing an RF bias to the support during the clamped part of the method. The RF power may, for example, be between 100 watts and 500 watts.

The first layer may be from about 0.5 µm-to about 2 µm thick, (preferably around 1 µm) and the second layer may be about 7 µm thick although greater thickness may be required for some applications.

The deposition steps may occur on different supports (e.g. in different deposition applications or modules) but it is preferred that the deposition steps are performed on the same support, in which case the second deposition step may be continuous with the first and be initiated by the clamping of the substrate. This is particularly readily achieved if the support is an electrostatic chuck.

As has been indicated the substrate is a 'thin' substrate and typically this would mean that its thickness is less than 250 µm. The substrate may be a silicon wafer.

The aluminium alloy is preferably Al (Cu, Si (@<5%).

Although the invention has been defined above it is to be understood it includes any inventive combination of the features set out above or in the following description.

BRIEF DESCRIPTION OF THE DRAWINGS

The invention may be performed in various ways and specific embodiments will now be described, by way of example, with reference to the accompanying drawings in which:

FIG. 1 shows a plot of stress versus platen temperature for a clamped 8 µm Al film;

FIG. 2 shows a plot of stress versus platen RF for clamped and unclamped 8 µAl films;

FIGS. 3, 4, 5, 6, 7, 8 and 9 are cross-section and surface SEM images of 8 µm Al film formed using respectfully different deposition conditions;

FIGS. 10, 11 and 12 show respective cross sections and surface views of films prepared in accordance with embodiments of the invention;

FIG. 13 shows a plot of wafer temperature against deposited film thickness for a 1.8 µm/min Al deposition;

FIG. 14 shows cross section and surface SEM of an embodiment of invention in which the wafer is biased;

FIG. 15 shows a cross section and surface SEM of an embodiment of the invention with no bias;

FIG. 16 is a plot of film reflectivity against platen bias for different deposition processes; and FIG. 17 is a plot illustrating the stress bias curve for an embodiment of the invention.

DETAILED DESCRIPTION OF EMBODIMENTS

In the light of the issues raised by the prior art deposition processes the inventors seek to achieve an approach the deposition of dense, smooth void free aluminium films with tuneable stress, even at low temperatures. In general they have determined that by depositing an unclamped aluminium seed layer of 0.5-2 µm in thickness, prior to clamping the film to complete the deposition at a low ESC platen temperature leads to an acceptable film. Using this technique it has proved possible to suppress the formation of very small columnar grains and improved the structure of the aluminium film, whilst retaining the low tensible stress. This is illustrated in FIGS. 10 to 11. A thin unclamped aluminium layer acts as a template for the growth of the rest of the film and suppresses the formation of the very small strong columnar grain structure, which is common in a standard clamped low temperature (<20° C.) deposition. It has been found that if the thickness of the unclamped seed layer is reduced to below around 0.5 µm, the columnar grain structure begins to reassert itself and the film becomes once again rough and voided as can be seen in FIG. 12, where the thickness of the seed layer is 0.2 µm Al.

The seed layer may be deposited either in a separate module or in the same module with the electrostatic chuck switched off. The platen temperature at which the unclamped seed layer is deposited is not the driving factor in the structural change. This is because in the case of an unclamped deposition, the wafer temperature can increase to a much higher temperature than the platen, due both to plasma heat and the latent heat of deposition. FIG. 13 shows the wafer temperature of an unclamped, full thickness Si wafer under deposition of a 1.8 µm/min aluminium film. The wafer temperature increases to >200° C. at the end of 1 µm deposition and may approach ~350° C. at the end of 8 µm deposition. If the wafer is being processed in the same module, it is possible that the electrostatic chuck may be cool from previous cooling.

However, the inherent heat generated by deposition will only usually be removed if the wafer is in good thermal contact with the platen (i.e. it is clamped) and there is some source of active cooling to remove the heat energy from the system. This realisation has enabled the inventors to deposit the seed layer on the same low temperature platen as the rest of the thick aluminium film. As was seen in connection with FIG. 7, increasing the initial wafer temperature using a pre-heat station is useful for obtaining better quality but the necessary wafer temperature is generally too high. It is also another processing step, with consequent cost and time implications.

Using the above basic process set out above, stress can still be controlled down to ~100 MPa compressive by applying RF bias during the clamping and at the same time a dense smooth film can be achieved. The affect of bias is illustrated in FIGS. 14 and 15.

The improvement in the film structure can also be indicated by the film reflectivity. It will be seen in FIG. 16 that this increases with the thickness of the unclamped seed layer. The reflectivity measurement is an indicator of surface roughness of aluminium films. It will be noted that the cold clamp films are inherently very rough and show much lower reflectivity compared to a smoother unclamped aluminium film.

FIG. 17 shows stress against platen RF for 8 µm Al film deposited using an embodiment of the invented process i.e. 1 µm unclamped seed layer and 7 µm clamped. The tuneable stress range for the new process with an unclamped seed layer is comparable with that obtained for a standard, cold clamped Al film. However, as discussed previously, a denser void free grain structure is maintained over the whole stress range making this process highly suitable for fabrication of practical semi-conductor devices.

The invention therefore provides a simple method for depositing aluminium at low temperatures in a manner which forms a smooth, dense, void free film with it stressed tuneable from low tensile through to compressive. The process may be formed at deposition temperatures of below 0° C. Stress tuning is achieved over a range down to ~100 MPa compressive while applying RF bias during the clamped deposition step. A favourable grain structure for device fabrication is retained over the entire stress range and with seed layers down to 0.5 µm in thickness. It will be understood that the benefit of improved film using the basic process is advantageous whether or not stress tuning is required.

What is claimed is:

1. A method of depositing a film on a substrate, comprising:
   placing the substrate on a support;
   depositing material comprising aluminum onto the substrate while the substrate is supported by but is unclamped relative to the support and under a condition in which the temperature of the substrate increases, to thereby form a first metallic layer consisting of aluminum or an aluminum alloy on the substrate; and
   subsequently depositing material comprising aluminum directly onto the first layer to form a second metallic layer, consisting of aluminum or an aluminum alloy, continuously on the first layer, and
   wherein the depositing of the material to form the second layer is carried out while the substrate is supported by and clamped to a support and is actively cooled to a temperature of less than about 22° C., and until the second layer is thicker than the first layer.

2. The method as claimed in claim 1 wherein an RF bias is provided to the support to which the substrate is clamped while the second layer is being formed.

3. The method as claimed in claim 2 wherein the RF power is between 100 and 500 w.

4. The method is claimed in claim 1 wherein the first layer is formed to be about 0.5 to 2 μm thick.

5. The method as claimed in claim 4 wherein the second layer is formed to be about 7 μm thick.

6. The method is claimed in claim 2 wherein the first layer is formed to be about 0.5 to 2 μm thick.

7. The method as claimed in claim 6 wherein the second layer is formed to be about 7 μm thick.

8. The method as claimed in claim 1 wherein the first and second layers are formed such that the ratio of the thickness of the first layer to the thickness of the second layer is between 1:3 and 1:15.

9. The method as claimed in claim 2 wherein the the first and second layers are formed such that the ratio of the thickness of the first layer to the thickness of the second layer is between 1:3 and 1:15.

10. The method as claimed in claim 1 wherein the supports that support the substrate while the first and second layers are formed, respectively, are different supports.

11. The method as claimed in claim 1 wherein the depositing to form the first layer and the depositing to form the second layer are carried out while the substrate is supported by the same support.

12. The method as claimed in claim 8 wherein the depositing to form the second layer is continuous with the depositing to from the first layer and is initiated by the clamping of the substrate.

13. The method as claimed in claim 1 wherein the substrate is less than 250 μm thick.

14. The method as claimed in claim 1 wherein the substrate is a silicon wafer.

15. The method as claimed in claim 1 where the depositing to form the second layer is carried out while the temperature of the substrate is actively cooled to be less than about 20° C.

16. The method as claimed in claim 1 wherein the first and second layers are both a layer of an aluminum alloy.

17. The method is claimed in claim 1 wherein the depositing to form the first layer is carried out using plasma and while the temperature of the substrate increases, as a result of the heat of the plasma and latent heat of deposition, to a temperature substantially greater than that of the support which supports the substrate while the first layer is being formed.

18. The method is claimed in claim 1 wherein the depositing to form the first layer and the depositing to form the second layer both are physical vapor deposition processes comprising sputtering.

* * * * *